United States Patent
Hansen et al.

(10) Patent No.: US 11,422,193 B2
(45) Date of Patent: Aug. 23, 2022

(54) SYSTEM AND METHOD FOR DETECTING FAILURES IN A BATTERY MANAGEMENT SYSTEM FOR A VEHICLE BATTERY

(71) Applicant: Volvo Car Corporation, Gothenburg (SE)

(72) Inventors: Sören Hansen, Gothenburg (SE); Nicklas Leuchovius, Gothenburg (SE); Louise Almquist, Gothenburg (SE); Pierre-Marie Heussaff, Gothenburg (SE)

(73) Assignee: Volvo Car Corporation, Gothenburg (SE)

( * ) Notice: Subject to any disclaimer, the term of this patent is extended or adjusted under 35 U.S.C. 154(b) by 59 days.

(21) Appl. No.: 17/099,845

(22) Filed: Nov. 17, 2020

(65) Prior Publication Data
US 2021/0148980 A1 May 20, 2021

(30) Foreign Application Priority Data
Nov. 18, 2019 (EP) .................................. 19209709

(51) Int. Cl.
*G01R 31/367* (2019.01)
*G01R 31/396* (2019.01)
(Continued)

(52) U.S. Cl.
CPC ............ *G01R 31/367* (2019.01); *B60L 58/12* (2019.02); *B60L 58/22* (2019.02); *G01R 31/006* (2013.01);
(Continued)

(58) Field of Classification Search
USPC ......................................... 324/426, 433–435
See application file for complete search history.

(56) References Cited

U.S. PATENT DOCUMENTS 7,723,955 B2  5/2010  Zaag et al.
8,796,993 B2  8/2014  White et al.
(Continued)

FOREIGN PATENT DOCUMENTS

EP  2085784 A3  5/2009
EP  2085784 A2  8/2009
(Continued)

OTHER PUBLICATIONS

Apr. 24, 2020 European Search Report issued on International Application No. 19209709.
(Continued)

*Primary Examiner* — Vincent Q Nguyen
(74) *Attorney, Agent, or Firm* — Clements Bernard Walker; Christopher L. Bernard

(57) ABSTRACT

The disclosed subject matter relates to a method and system for detecting failures in a cell measuring circuit for a vehicle battery including a plurality of battery cells. First the method includes determining a cell voltage of each of the plurality of cells by the respective cell measuring circuit. Next, the method includes performing cell balancing to balance a cell voltage for the plurality of cells and the cell balancing times are compared to determine if there are deviating cell balancing times, and if there is an identifiable pattern in the cell balancing times which can provide an indication of a failure in any of the cell measuring circuits.

15 Claims, 4 Drawing Sheets

(51) Int. Cl.
 *B60L 58/22* (2019.01)
 *B60L 58/12* (2019.01)
 *G01R 31/00* (2006.01)

(52) U.S. Cl.
 CPC ...... *G01R 31/396* (2019.01); *B60L 2240/547* (2013.01)

(56) References Cited

U.S. PATENT DOCUMENTS

| | | | |
|---|---|---|---|
| 9,097,774 | B2 | 8/2015 | White et al. |
| 9,562,949 | B2 | 2/2017 | Kuroda |
| 9,876,369 | B2 | 1/2018 | McCormick et al. |
| 10,063,068 | B1 | 8/2018 | Mccormick |
| 10,790,677 | B2 * | 9/2020 | Nam ..................... H02J 7/0047 |
| 2011/0285538 | A1 | 11/2011 | Lee et al. |
| 2011/0285539 | A1 | 11/2011 | Lee et al. |
| 2013/0257382 | A1 * | 10/2013 | Field ..................... H01M 10/44 320/136 |
| 2015/0260799 | A1 * | 9/2015 | Kuroda ................ G01R 31/382 324/434 |

FOREIGN PATENT DOCUMENTS

| | | |
|---|---|---|
| JP | 2007085847 A | 4/2007 |
| JP | 20090210480 A | 9/2009 |
| KR | 20100020113 A1 | 2/2010 |

OTHER PUBLICATIONS

Cao et al., Battery Balancing Methods: A Comprehensive Review, IEEE, Vehicle Power and Propulsion Conference (VPPC), Sep. 3-5, 2008, Harbin, China.

* cited by examiner

SYSTEM AND METHOD FOR DETECTING FAILURES IN A BATTERY MANAGEMENT SYSTEM FOR A VEHICLE BATTERY

CROSS-REFERENCE TO RELATED APPLICATION

The present disclosure claim the benefit of priority of co-pending European Patent Application No. 19209709.5, filed on Nov. 18, 2019, and entitled "SYSTEM AND METHOD FOR DETECTING FAILURES IN A BATTERY MANAGEMENT SYSTEM FOR A VEHICLE BATTERY," the contents of which are incorporated in full by reference herein.

TECHNICAL FIELD

The present disclosure relates to a system and method for detecting failures in a battery circuit for a vehicle battery. In particular, the disclosure relates to a method and system for detecting component failure in a cell measuring circuit in a battery including a plurality of battery cells.

BACKGROUND

With the development of electrical and hybrid vehicles comes safety requirements related to the high-voltage electrical systems of such vehicles. Some of the requirements are defined by vehicle safety standards such as ISO 26262, "Road vehicles—Functional safety", where the highest safety level defined by the ISO-standard is ASIL-D (Automotive Safety Integrity Level).

One application where a high level of safety is required relates to monitoring and balancing of the battery cells in an electric or hybrid vehicle. Battery cell monitoring and cell balancing is typically performed by dedicated cell monitoring/measuring circuitry. To fulfil the required safety levels, such circuitry needs to consist of components having very low failure rates, which may require expensive components, and/or the inclusion of other safety measures such as redundancy, potentially making the cell monitoring system more costly and complicated.

Some known failure modes in control circuitry for a vehicle high-voltage battery may for example lead to cell overcharging which in turn may lead to a thermal event.

Accordingly, there is a need for improved cell measuring and monitoring circuitry in fulfilling the required safety levels.

SUMMARY

In general, the disclosed subject matter relates to a method and system for detecting failures in a cell measuring circuit for a vehicle battery including a plurality of battery cells. First the method includes determining a cell voltage of each of the plurality of cells by the respective cell measuring circuit. Next, the method includes performing cell balancing to balance a cell voltage for the plurality of cells and the cell balancing times are compared to determine if there are deviating cell balancing times, and if there is an identifiable pattern in the cell balancing times which can provide an indication of a failure in any of the cell measuring circuits.

The described method further includes detecting a first cell having a cell balancing time being lower than an average cell balancing time for the plurality of cells; detecting that at least one cell adjacent to the first cell have a cell balancing time higher than the average cell balancing time for the plurality of cells; and if the difference in cell balancing time between the first cell and the at least one adjacent cell is higher than a predetermined balancing time threshold value, determining that the cell measuring circuit for the first cell is faulty.

An advantage of the described method is that it can detect failures that would not be detectable by only monitoring the cell voltage. The balancing function will aim to balance the cells so that the cell voltage will be the same for all cells. If failure was to occur suddenly and is sufficiently large, the failure would be seen in the cell voltage. However, at a later point in time, the failure would not be seen be seen in the cell voltage but only in cell balancing time since the cell balancing function evens out the cell voltages. Furthermore, if the failure is a slow degradation of the component, then the failure cannot be distinguished from a normal deviation and the cell will slowly be balanced to keep the voltage difference low. Over time the error in the measurement due to a faulty cell measurement circuit will be big but it will not be detected when measuring the cell voltages, but it will be seen on the balancing time.

Accordingly, the present disclosure provides a method for determining a fault in a cell measuring circuit which is based on detecting a pattern in the cell balancing times. The method can thus be employed without modifications to the cell measuring circuit as such, and the required safety levels can be reached without costly and complicated system designs.

DETAILED DESCRIPTION

Figure 1:
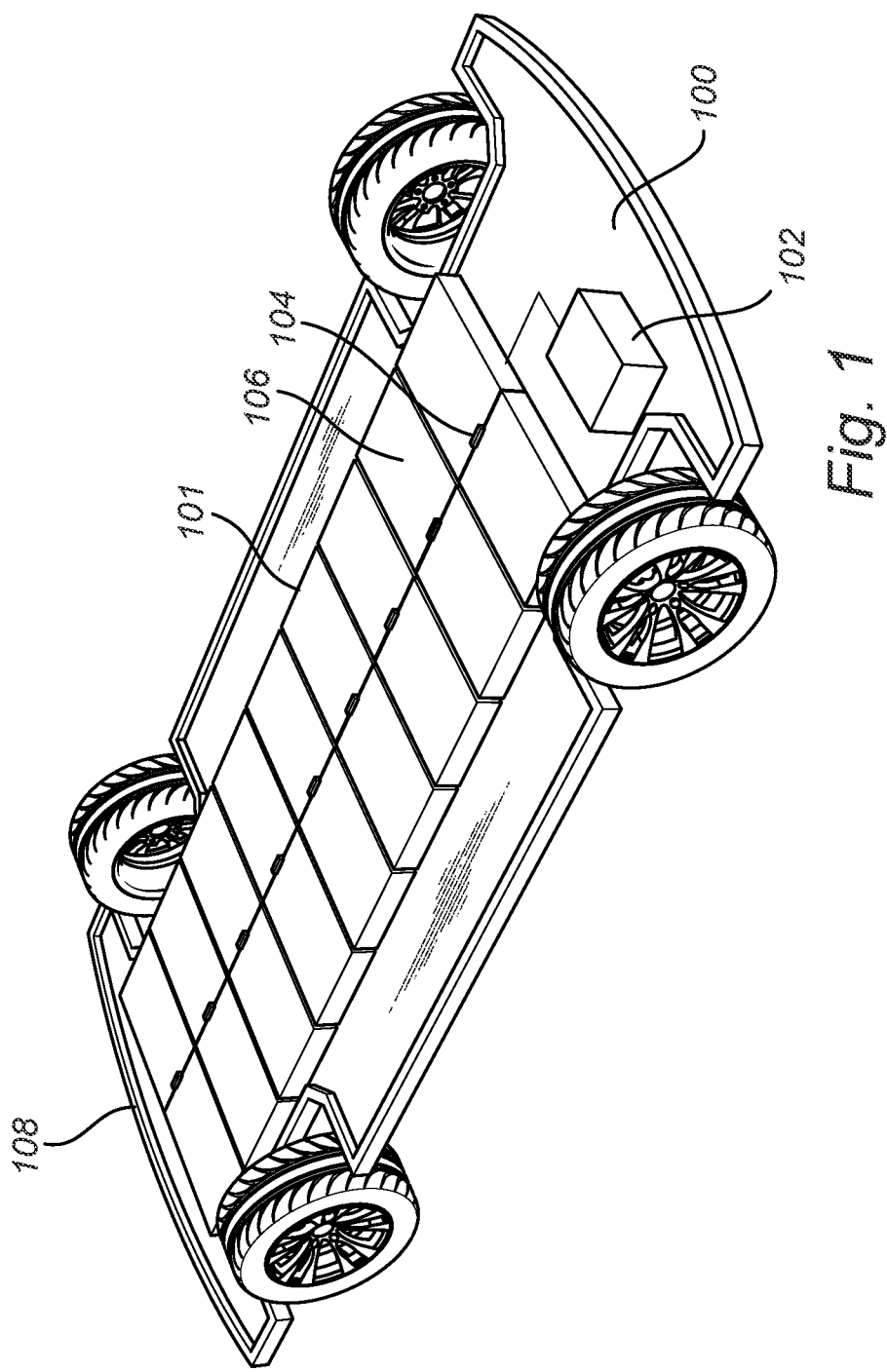
FIG. 1 is a schematic illustration of a battery management system for a vehicle battery according to an embodiment of the disclosure.

The present disclosure will now be described more fully hereinafter with reference to the accompanying drawings, in which currently preferred embodiments of the disclosure are shown. This disclosure may, however, be embodied in many different forms and should not be construed as limited to the embodiments set forth herein; rather, these embodiments are provided for thoroughness and completeness, and fully convey the scope of the disclosure to the skilled person. Like reference characters refer to like elements throughout.

In the following description, the claimed battery management system and method for detecting failures in a cell measuring circuit will be described with reference to a battery management system and a battery in a car. However, the described battery management system and method may equally well be used in other types of vehicles including chargeable batteries having a plurality of battery cells, such as boats or other marine vehicles, trucks, buses and aerial vehicles such as drones, airplanes and helicopters.

FIG. 1 schematically illustrates a battery management system 100 for a vehicle battery 101. The battery management system 100 includes a battery management control unit 102 connected to a plurality of cell measuring circuits 104, each cell measuring circuit being connected to a battery cell 106 such that each battery cell 106 has a dedicated cell measuring circuit 104.

The battery management control unit 102 may include a microprocessor, microcontroller, programmable digital signal processor or another programmable device. The control unit 102 may also, or instead, include an application specific integrated circuit, a programmable gate array or programmable array logic, a programmable logic device, or a digital signal processor. Where the control unit 102 includes a programmable device such as the microprocessor, microcontroller or programmable digital signal processor mentioned above, the processor may further include computer executable code that controls operation of the programmable device. The functionality of the control unit 102 may be provided by one dedicated control unit 102, or it may be distributed over a plurality of control units. Moreover, the control unit may also be referred to as an ECU (Electronic Control Unit).

Figure 2:
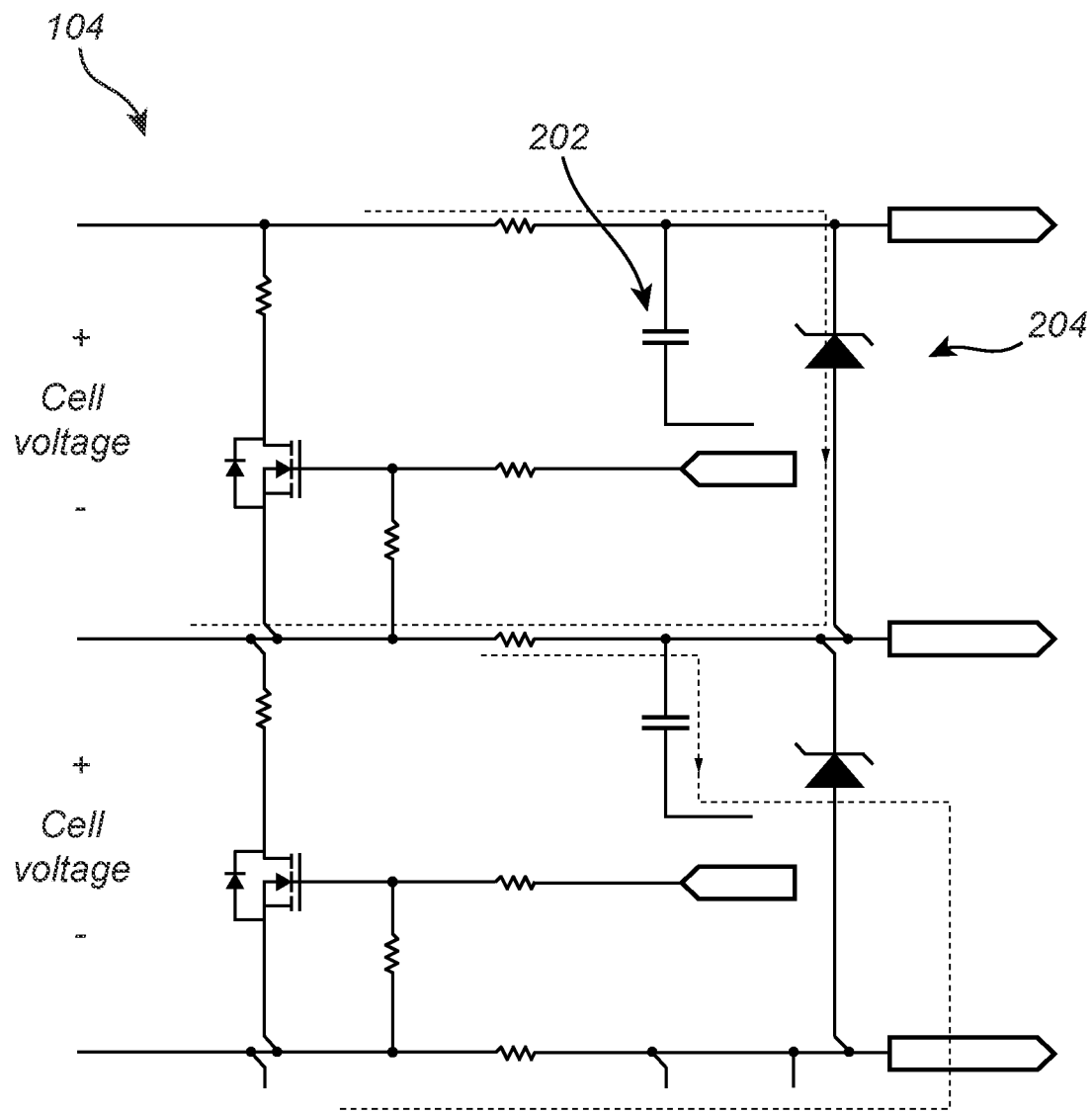
FIG. 2 is a circuit schematic illustrating a cell measuring circuit for a vehicle battery according to an embodiment of the disclosure.

FIG. 2 is a circuit schematic illustrating a cell measuring circuit 104 for a vehicle battery 101 according to an embodiment of the disclosure. The cell measuring circuit 104 is arranged to measure the voltage of each battery cell. In the cell measuring circuit 104, a capacitor 202 is arranged as a filter to improve EMC properties and a Zener diode 204 is arranged to provide overvoltage protection. Accordingly, a fault in either the capacitor 202 or the Zener diode 204 can be critical to function of the battery cell.

Figure 3:
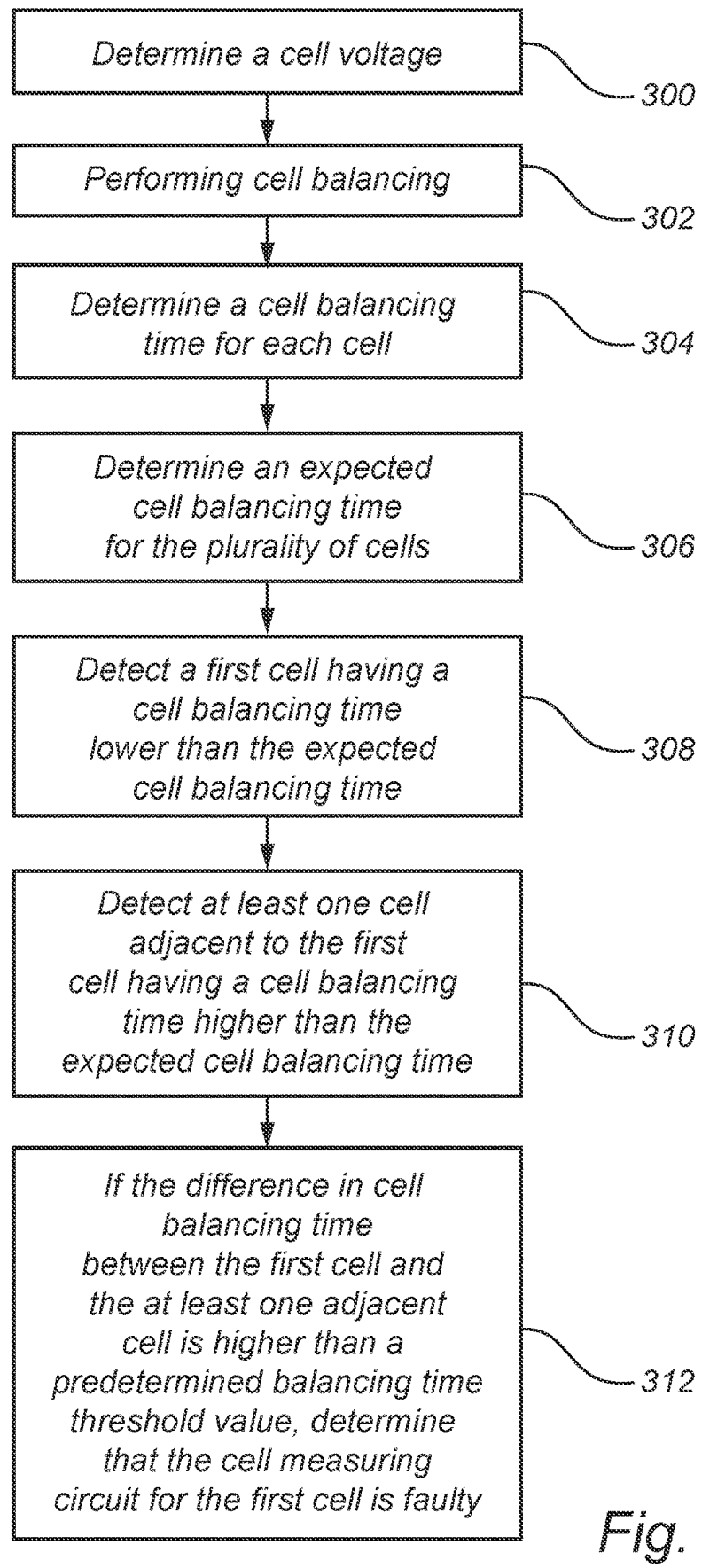
FIG. 3 is a flow chart outlining the general steps of a method for detecting failures in a cell measuring circuit according to an embodiment of the disclosure.

FIG. 3 is a flow chart outlining the general steps of a method for detecting failures in a cell measuring circuit 104 for a vehicle battery 101 including a plurality of battery cells 106 according to an embodiment of the disclosure. The battery management control unit 102 is configured to perform the steps of the method as will be described in the following. The method includes determining 300 a cell voltage of each of the plurality of cells 106 by the respective cell measuring circuit 104. Accordingly, the cell voltages are determined to decide if cell balancing is needed and if so, how much cell balancing is needed and for which of the cells. Cell balancing is trigged by a difference in cell voltage at a specific cell voltage level (State-of-charge). The trigger for cell balancing can for example be controlled by an algorithm which is outside of the scope of the present disclosure. Moreover, various cell balancing schemes are well known in the field of battery management systems.

In the next step, cell balancing is performed 302 to balance a cell voltage for the plurality of cells, and a cell balancing time for each cell is determined 304. In order to improve the accuracy of the determined cell balancing time, the battery management control unit can be configured to increase the SoC threshold defining when cell balancing is triggered. In other words, if cell balancing is performed for small differences in SoC between cells, the determined cell balancing time may be more inaccurate.

The method further includes determining 306 an expected cell balancing time for the plurality of cells. The expected cell balancing time may for example be a predetermined value based on known parameters such as cell voltage and cell state-of-charge. The expected cell balancing time may also be based on previous empirical data describing cell balancing properties. In the following description, the expected cell balancing time will be described as the average cell balancing time for all cells. Accordingly, the cell balancing time for an individual battery cell is expected to be within a predetermined range of the average cell balancing time for all of the cells 106 in the battery pack 101. Thereby, the method also includes storing the cell balancing time for each of the cells. When determining the average cell balancing time, it may be preferable to exclude the cells having the highest and lowest cell balancing time in order to reach an average value more representative of a normally functioning battery cell and cell measuring circuit. Thereby, faulty cells and faulty cell balancing circuits are not included in the determination of the average cell balancing time against which the cell balancing time for all cells are compared.

The cell balancing time is here defined as the total time that the cell is subject to cell balancing, and the cell balancing time may be determined as an accumulated cell balancing time for the respective cell. Thereby, the cell balancing time is not based on only one cell balancing event. To achieve an accurate comparison, the starting point from when the cell balancing times are accumulated is the same for all cells.

The next step includes detecting 308 a first cell having a cell balancing time lower than the expected cell balancing time for the plurality of cells and detecting 310 that at least one cell adjacent to the first cell have a cell balancing time higher than the expected cell balancing time for the plurality of cells. One individual cell may have deviating cell balancing time for a number of reasons, such as for an old or faulty cell, and it cannot be determined based on one deviating cell alone if there is a fault in the cell or if there is a fault in the cell balancing circuitry 104. Accordingly, the cell balancing time for cells adjacent to the deviating cell is also acquired, and if a pattern is detected where one cell has a lower than expected cell balancing time and at least one adjacent cell has a higher than expected cell balancing time, it is further determined if the difference in cell balancing time between the first cell and the at least one adjacent cell is higher than a predetermined balancing time threshold value.

If the difference in cell balancing time between the first cell and the at least one adjacent cell is higher than a predetermined balancing time threshold value, it can be determined 312 that the cell measuring circuit 104 for the first cell is faulty. Moreover, the cell balancing time may be compared to several different time threshold values. For example, a first time threshold value can be set to indicate a limit where there may be preferable to service or replace the battery cell or cell measuring circuit in order tom improve the life length of the battery cell, but where there is no safety issue. A second time threshold value higher than the first time threshold value can be set as a threshold value where a faulty cell measuring circuit poses a safety hazard and where repair or replacement is required. Moreover, the specific value for the time threshold values depends on the relation between cell balancing time and cell voltage value, and the time threshold values are thereby determined for the given implementation at hand and is based on properties of the battery cell and of the cell measuring circuit.

As illustrated in FIG. 2, the cell measuring circuit 104 includes a capacitor 202 and a Zener diode 204 connected in parallel with the battery cell, and the method further includes determining that the cell measuring circuit 104 is faulty if it can be determined that either of the Zener diode 204 or the capacitor 202 is faulty. Moreover, as will be described in the following, it can be determined if it is the capacitor 202 or the Zener diode 204 that is faulty based on the pattern of the deviating cell balancing times.

Figure 4:
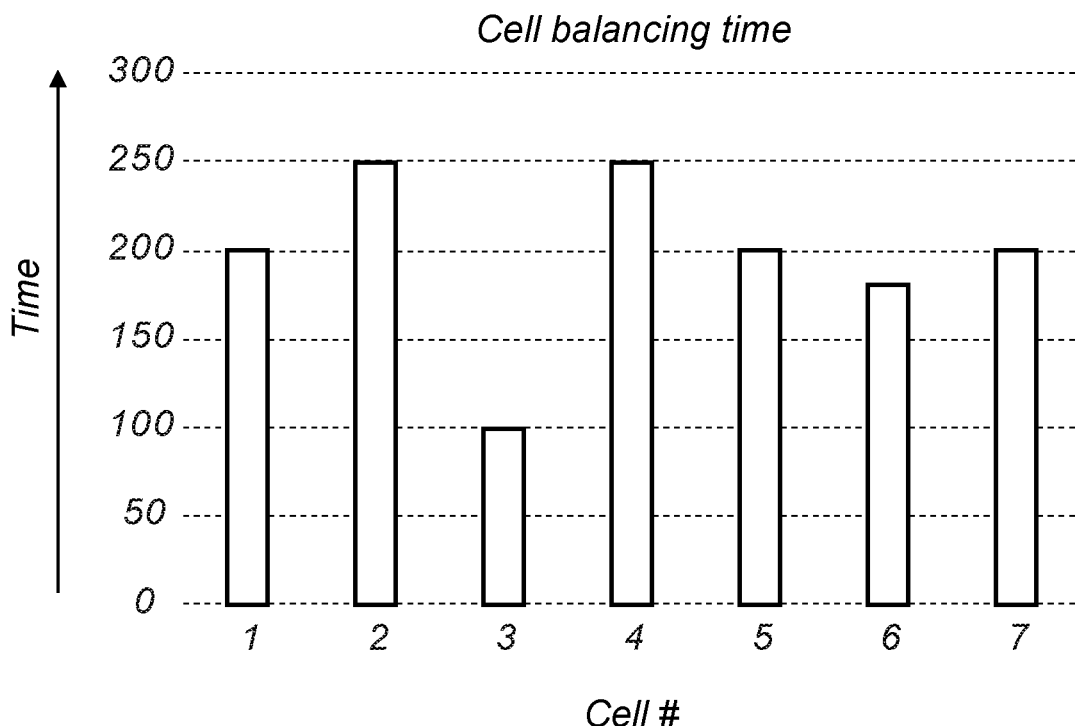
FIG. 4 is a graph illustrating features of the method and system according to an embodiment of the disclosure.

FIG. 4 is graph schematically illustrating cell balancing times for a number of battery cells. In order to determine if the cell measuring circuit includes a faulty Zener diode, the method includes detecting that a second cell adjacent to the first cell has a higher than expected cell balancing time and that a third cell adjacent to the first cell has a higher than expected cell balancing time; and determining that the capacitor of the cell balancing circuitry of the first cell is faulty. In the illustrated example, the first cell is cell #3, which has a lower than average cell balancing time. Moreover, the neighboring cells #2 and #4 have cell balancing times which are higher than expected. For the Zener diode failure illustrated in FIG. 4, and with further reference to FIG. 2, a current through the Zener diode, in the direction that is blocked by a functioning diode, will lead to a voltage drop over the circuit resistors which in turn causes the measured cell voltage to drop. Moreover, due to the voltage drop, each of the adjacent cells will experience an increased voltage by half of the amount of the voltage drop. Thereby, it can be determined that the Zener diode 202 of the cell measuring circuit 104 is faulty. In the described examples, the expected cell balancing time can be taken to be the average cell balancing time. In a practical application, the battery pack can also be assumed to include a larger number of battery cells such that the average cell balancing time for the plurality of cells is not largely influences by a few (i.e. 2-3) cells having deviating cell balancing times.

Figure 5:
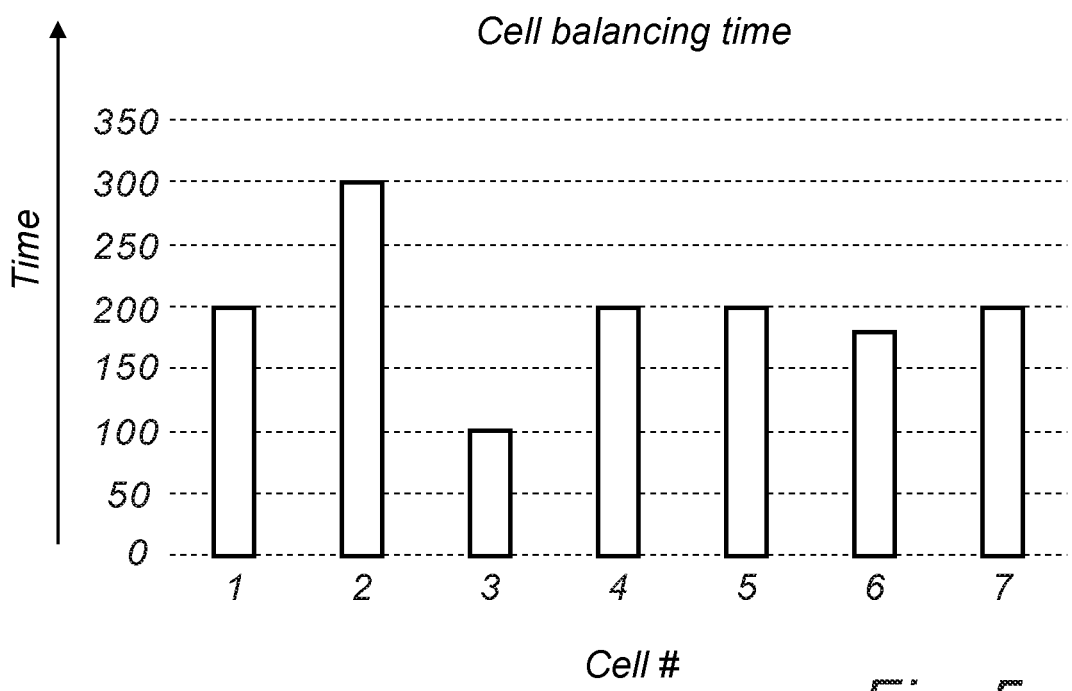
FIG. 5 is a graph illustrating features of the method and system according to an embodiment of the disclosure.

FIG. 5 is graph schematically illustrating cell balancing times for a number of battery cells. In order to determine if the cell measuring circuit includes a faulty capacitor, the method includes detecting that a second cell adjacent to the first cell has a higher than average cell balancing time and that a third cell adjacent to the first cell has an average cell balancing time; and determining that the capacitor of the cell balancing circuitry of the first cell is faulty. In the illustrated example, the first cell is cell #3, which has a lower than average cell balancing time. Moreover, of the neighboring cells #2 and #4, cell #2 has a cell balancing times which are higher than average and cell #4 has an average cell balancing time. For the capacitor failure illustrated in FIG. 5, and with further reference to FIG. 2, a faulty capacitor allowing a current to run through the capacitor will lead to a current through the filter resistors which in turn will cause a voltage drop. The measured voltage over the cell will drop due to this failure and the voltage over the cell above will also increase with the same voltage. Thereby, it can be determined that the capacitor 202 of the cell measuring circuit 104 is faulty. A capacitor failure may for example be detected if a capacitor has a higher than normal self-discharging rate.

As can be seen in FIGS. 4 and 5, the cell including a faulty cell measuring circuit 104 will have lower than expected cell balancing time. This occur since the faulty cell measuring circuit 104 will result in a lower measured voltage for that cell, and to compensate the rest of the cells in the pack are drained on charge (balanced) to reach the same lower voltage.

The cells in the battery pack are connected in series such that each cell has two neighbors except for the cells at edges of the pack. This means that it may not be possible to determine the nature of a filature in a cell measuring circuit at the edge of the battery pack, i.e. if it is a faulty capacitor or a faulty Zener diode. However, the most important aspect is to determine if there is a failure at all, since a faulty cell measuring circuit may lead to overcharging and potentially excessive heating of a battery cell.

The failures that is detected by this method is some of the possible failures that can occur to the described components where Zener level drift is a rare but likely failure mode and also a slow increase in the capacitor self-discharge is a rare but likely failure mode.

An additional feature to consider when determining if the cell measuring circuit is faulty is the age of the battery. As the battery ages, the spread in cell balancing time for the cells is expected to diverge, leading to an irregular pattern for the cell balancing times. This can for example be addressed by periodically resetting the accumulated cell balancing time used for determining if the cell measuring circuit is faulty. Moreover, the balancing time threshold value can be determined based on an age of the battery, for example by being proportional to the age of the battery, at least for a comparison aimed at finding non-critical faults. Accordingly, an older battery may be allowed to exhibit a larger spread in cell balancing times before it is determined that the cell measuring circuit 104 is faulty. For the detection of safety critical faults, the cell balancing time threshold value is preferable the same irrespective of the age of the battery pack.

By means of the described method and system, critical faults in the cell measuring circuits of battery packs for vehicles can be detected without additional components or circuitry, which makes it bot easy to implement and cost effective since only software modifications may be required in existing systems.

According to one embodiment of the disclosure, there is provided a battery management system for a vehicle battery; the system including a battery management control unit connected to a plurality of cell measuring circuits, each cell measuring circuit being connected to a battery cell, wherein the battery management control unit is configured to: determine a cell voltage of each of the plurality of cells by the respective cell measuring circuit; perform cell balancing to balance a cell voltage for the plurality of cells; determine a cell balancing time for each cell; determine an expected cell balancing time for the plurality of cells; detect a first cell having a cell balancing time being lower than an average cell balancing time for the plurality of cells; detect that at least one cell adjacent to the first cell have a cell balancing time higher than the average cell balancing time for the plurality of cells; and if the difference in cell balancing time between the first cell and the at least one adjacent cell is higher than a predetermined balancing time threshold value, determine that the cell measuring circuit for the first cell is faulty.

According to one embodiment of the disclosure, there is provided a computer program, including instructions which, when executed on at least one processor, cause the at least one processor to carry out the method according to any one of the aforementioned embodiments, and a computer-readable storage medium, having stored thereon such a computer program.

Even though the disclosure has been described with reference to specific exemplifying embodiments thereof, many different alterations, modifications and the like will become apparent for those skilled in the art. For example, the method may be used also for other types of cell measuring circuits. Also, it should be noted that parts of the method and system may be omitted, interchanged or arranged in various ways, the method and system yet being able to perform the functionality of the present disclosure.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality.

The mere fact that certain measures are recited in mutually different dependent claims does not indicate that a combination of these measured cannot be used to advantage.

The invention claimed is:

1. A method for detecting failures in a cell measuring circuit for a vehicle battery comprising a plurality of battery cells, each cell having a cell measuring circuit connected to the cell, the method comprising:
   determining a cell voltage of each of the plurality of cells by the respective cell measuring circuit;
   performing cell balancing to balance a cell voltage for the plurality of cells;
   determining a cell balancing time for each cell;
   determining an expected cell balancing time for the plurality of cells;
   detecting a first cell having a cell balancing time lower than the expected cell balancing time for the plurality of cells;
   detecting that at least one cell adjacent to the first cell have a cell balancing time higher than the expected cell balancing time for the plurality of cells; and
   determining that the cell measuring circuit for the first cell is faulty when the difference in cell balancing time between the first cell and the at least one adjacent cell is higher than a predetermined balancing time threshold value.

2. The method according to claim 1, wherein determining an expected cell balancing time for each cell comprises determining an average cell balancing time for the plurality of cells.

3. The method according to claim 2, wherein the cell balancing time for each cell is determined as an accumulated cell balancing time.

4. The method according to claim 1, wherein the cell measuring circuit comprises a capacitor and a Zener diode connected in parallel with the battery cell, and wherein determining that the cell measuring circuit is faulty comprises determining that the capacitor or the Zener diode is faulty.

5. The method according to claim 4, further comprising:
   detecting that a second cell adjacent to the first cell has a higher than expected cell balancing time and that a third cell adjacent to the first cell has a higher than expected cell balancing time; and
   determining that the Zener diode of the cell balancing circuitry of the first cell is faulty.

6. The method according to claim 4, further comprising:
   detecting that a second cell adjacent to the first cell has a higher than expected cell balancing time and that a third cell adjacent to the first cell has an expected balancing time; and
   determining that the capacitor of the cell balancing circuitry of the first cell is faulty.

7. The method according to claim 1, wherein the balancing time threshold value is determined based on an age of the battery.

8. The method according to claim 7, wherein the balancing time threshold value is proportional to the age of the battery.

9. A battery management system for a vehicle battery; the system comprising a battery management control unit connected to a plurality of cell measuring circuits, each cell measuring circuit being connected to a battery cell, wherein the battery management control unit is configured to:
   determine a cell voltage of each of the plurality of cells by the respective cell measuring circuit;
   perform cell balancing to balance a cell voltage for the plurality of cells;
   determine a cell balancing time for each cell;
   determine an expected cell balancing time for the plurality of cells;
   detect a first cell having a cell balancing time being lower than an average cell balancing time for the plurality of cells;
   detect that at least one cell adjacent to the first cell have a cell balancing time higher than the average cell balancing time for the plurality of cells; and
   determine that the cell measuring circuit for the first cell is faulty when the difference in cell balancing time between the first cell and the at least one adjacent cell is higher than a predetermined balancing time threshold value.

10. The system according to claim 9, wherein the expected cell balancing time is an average cell balancing time for the plurality of cells.

11. The battery management system according to claim 9, wherein the cell balancing circuit comprises a capacitor and a Zener diode connected in parallel with the cell, and the battery management control unit is configured to determine that the cell measuring circuit is faulty is it is determined that the Zener diode or the capacitor is faulty.

12. The battery management system according to claim 9, wherein the battery management control unit is configured to determine the cell balancing time for each cell as an accumulated cell balancing time.

13. The battery management system according to claim 11, wherein the battery management control unit is further configured to detect that a second cell adjacent to the first cell has a higher than average cell balancing time and that a third cell adjacent to the first cell has an average cell balancing time; and to determine that the capacitor of the cell balancing circuitry of the first cell is faulty.

14. The battery management system according to claim 9, wherein the battery management control unit is further configured to detect that a second cell adjacent to the first cell has a higher than average cell balancing time and that a third cell adjacent to the first cell has a higher than average cell balancing time; and to determine that the Zener diode of the cell balancing circuitry of the first cell is faulty.

15. A vehicle comprising the battery management system according to claim 9.

* * * * *